March 4, 1969 C. P. DE VITO 3,431,541

COMBINATION MOUNTING PIN AND SOLDER WELL TERMINAL

Filed March 4, 1966

INVENTOR.
CHARLES P. DE VITO

BY Hill, Sherman, Meroni, Gross & Simpson ATTORNEYS

United States Patent Office 3,431,541
Patented Mar. 4, 1969

3,431,541

COMBINATION MOUNTING PIN AND SOLDER WELL TERMINAL

Charles P. De Vito, Park Ridge, Ill., assignor to Alcon Metal Products, Inc., Chicago, Ill., a corporation of Delaware Filed Mar. 4, 1966, Ser. No. 531,927
U.S. Cl. 339—128 10 Claims
Int. Cl. H02b *1/02;* H01r *9/08, 5/04*

ABSTRACT OF THE DISCLOSURE

For retaining a component carrying member and assembly on an apertured panel a hollow pin has a base fixed to the member by shoulder structure which serves as a stop against the face of the panel with a portion of the pin extending through the aperture and having locking lugs struck out therefrom with locking edges engaging the opposite face of the panel from the shoulder structure.

This invention relates to means for mounting electrical terminal-carrying members on supporting panels such as in radio and TV chassis and like apparatus, and more particularly concerns a new combination mounting pin and solder well terminal.

In mounting on chassis panels, members such as terminal strips, tube sockets, transistor sockets or mounts, and the like, it is desirable to apply the respective members against one face of the supporting panel with the electrical terminals projecting through suitable apertures for access at the opposite face of the panel. Prior means for this purpose have either been awkward and time consuming in application to effect a secure retention, or have been inadequate to assure positive retention.

It is, accordingly, an important object of the present invention to provide a new and effective mounting pin structure for retaining in assembly various types of electrical connecting devices and mounting panels in electrical equipment.

Another object of the invention is to provide a new combination mounting pin and solder well terminal which is especially suitable for use in connecting terminal strips, electrical sockets, and the like on supporting panels such in the chassis of electrically operated equipment, of which radios and television sets are examples.

A further object of the invention is to provide a novel mounting pin for the purpose indicated enabling snap-on mounting and positive retention of electrical components on chassis panels and the like.

Still another object of the invention is to provide a new combination mounting pin and solder well terminal construction.

Other objects, features and advantages of the present invention will be readily apparent from the following detailed description of certain preferred embodiments thereof taken in conjunction with the accompanying drawings, in which:

FIGURE 1 is a top plan view of a combination mounting pin and solder well terminal embodying features of the invention;

FIGURE 2 is a side elevational view of the pin and terminal member of FIGURE 1;

FIGURE 3 is a plan view of a stamped sheet metal blank from which the combination pin and solder well terminal is shaped;

FIGURE 4 is a fragmental plan view of the solder well terminal strip mounted on a chassis panel or the like;

FIGURE 5 is a side elevational view of the assembly of FIGURE 4;

FIGURE 6 is a plan view of a tube socket carrying solder well terminals and including combination mounting pins and solder well terminals thereon; and FIGURE 7 is a side elevational view of the tube socket.

Figures 1, 2, 3, 4, 5, 6, 7:
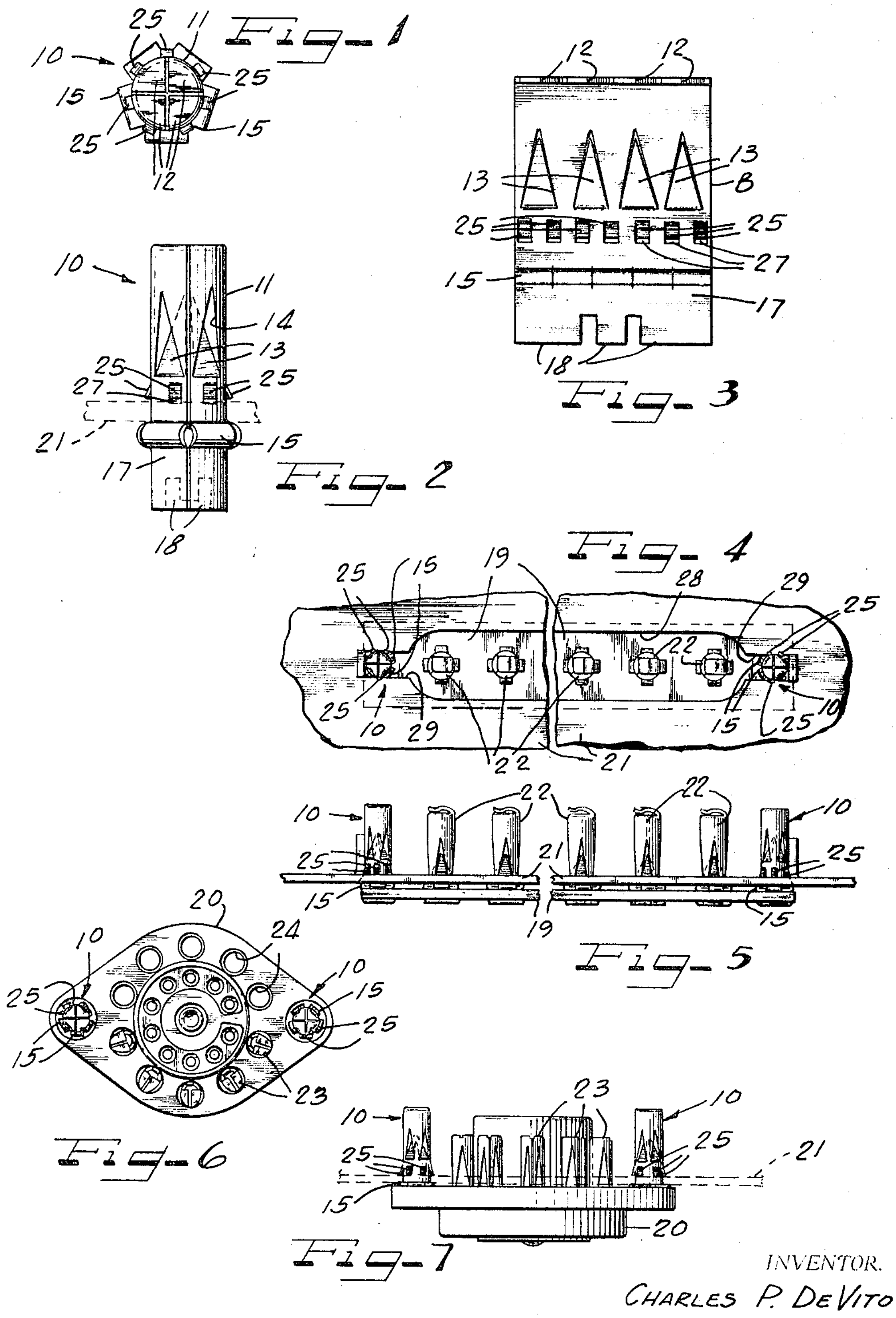

A tubular mounting pin 10 (FIGS. 1 and 2) embodying features of the invention and also serving as a solder well terminal is constructed from a sheet metal blank B (FIG. 3) die stamped in accordance with conventional practice from suitable strip material. The combination pin and terminal comprises a tubular body 11 open at least at one end and desirably substantially closed at the opposite end as by means of complemental crown sector lugs 12 which are bent up normal to the plane of the flat blank and cooperate in the tubular form of the body 11 to provide a substantially closed crown. This crown functions as a stop for the ends of electrical wires that may be inserted into the hollow body 11 through its open end into engagement with and past a set of inwardly convergently inclined wire-gripping and retaining prongs 13 partially lanced or sheared from the material of the body 11 and bent inwardly into convergence and to project toward the inner side of the crown and in spaced relation thereto. Strikout openings 14 from which the fingers or prongs 13 are derived provide access for solder into the interior of the body 11 for anchoring the electrical wires therein.

For attachment of the pin and terminal member 10 to a member with which it is to be used, the body 11 is provided with a stop shoulder 15 thereabout, in the nature of a bead projecting outwardly to a suitable greater diameter than the diameter of the body and located intermediate and substantially spaced from the base ends of the retaining prong fingers 13 and the open end of the body. Between the shoulder 15 and the open end extremity of the body is defined an attachment neck 17 adapted to be received within a complementary aperture in a carrying member and with the free end of the neck separated into a plurality of bendable clenching lugs 18. Although the tubular pin and terminal 10 has been illustrated as substantially cylindrical in form, it may be made of any desired cross sectional shape other than cylindrical, such as square, rectangular, hexagonal, etc.

In use, one or more, and generally two, of the combination mounting pin and terminal elements 10 are adapted to be attached to a dielectric terminal strip 19 (FIGS. 4 and 5), the mounting flange of a tube socket 20 (FIGS. 6 and 7) or similar electrical member designed to be mounted on a panel 21 such as that of a radio or television set chassis or other electrically operated equipment. The attachment neck 17 of the pin base extends through a suitable complementary aperture in the carrying member, with the shoulder 15 bearing against one face of the carrying member and the clenching lugs 18 bent outwardly in opposition to the shoulder 15 to clamp the base of the pin to the carrying member. The terminal bearing strip 19 may be of any desired length and has mounted thereon a plurality of solder well terminals 22 or any other electrical device desired. In the illustrated instance the strip 19 has one of the pin elements 10 mounted adjacent to each opposite end and projecting in the same direction as the terminals 22. In respect to the socket member 20, one of the pins 10 is mounted on each of the opposite end portions of the mounting flange of the socket which also has attached thereto a series of solder well terminals 23 projecting in the same direction as the pins 10 and aligned with suitable holes 24 through the socket flange.

Means are provided for enabling snap-on mounting of the pin-carrying member on the mounting panel 21. For this purpose, the body 11 is provided with a circumferentially spaced series of outwardly angled, resiliently flexible locking tabs or lugs 25 integrally joined to the body in adjacently spaced relation to the junctures of the retaining fingers 13 with the bottom, sheared and struck out from openings 27 and angled generally toward the outwardly bulged shoulder 15. At their free ends or tip edges, the lugs 25 are spaced from the shoulder 15 a distance which will accommodate the thickness of the panel 21 freely but relatively closely therebetween. Through this arrangement, mounting of the member carrying the retaining pins 10, such as the terminal strip 19, is readily effected upon the panel 21 by projecting the terminals 22 through a suitable clearance aperture 28 in the panel, and aligning and projecting the retaining pins 10 through respective pin-receiving slots 29 which may be extensions from the aperture 28. Each of the slots 29 is complementary in width to the diameter of the pin 10, to receive the pin in freely slidable relation therethrough. Each of the slots 29 presents at least two opposed edges to the perimeter of the pin body, and such edges are closer together than the spread apart diameter about the tips of the retaining lugs 25. As a result, when the pin-carrying member is pressed toward the panel 21 with the mounting pins 10 aligned within the slots 29, the retaining lugs are cammed to displace flexibly inwardly until their tips have cleared through the respective slot and past the edges of the slot, whereupon the lugs spring outwardly into opposing relation at their tips with the confronting face of the panel, the opposite face confronting and being engageable with the shoulder 15 serving as a stop. Thereby, the panel is substantially gripped between the shoulder 15 and the retaining lugs 25 and removal of the pin-carrying member is thoroughly resisted.

In order to assure that at least two of the retaining lugs 25 at respectively opposite sides of the pin 10 will relate lockingly to the panel 21 in any possible relative angular position of the pin on the carrying member, the lugs 25 are desirably of relatively narrow dimension, numerous and extended to such a diameter about the body 11 that they cannot miss the locking relationship with the margins defining the respective receiving openings in the mounting panel. An advantageous arrangement comprises, as shown, an uneven number of the lugs 25 in the annular series, coplanar at their tips in a plane transverse and normal to the axis of the pin, and as closely spaced as practicable, consistent with shearing die practice. This assures, as well seen in FIGURE 4, that at diametrically opposite sides at least one of the lugs 25 will be in full locking tip opposition to the panel 21, while an opposite pair of the locking lugs will be in at least partial locking opposition to the mounting panel. A practical construction wherein the pin 10 has been of about $\frac{5}{32}$ inch in diameter, seven of the lugs 25 of about $\frac{1}{32}$ inch in width, spaced about $\frac{1}{32}$ inch apart and of about $\frac{3}{64}$ inch in length has been found quite successful. While these lugs are adequately resiliently flexible in a direction toward and away from the pin body perimeter, they are quite stiff in their length and width dimensions and thus strongly resist distortion in those dimensions. Therefore, after assembly with the panel 21 those of the lugs 25 which lockingly oppose the mounting panel afford great resistance to disassembly of the carrying member from the panel, assuring permanence unless the lugs are deliberately bent back into the pin body to clear the edges defining the mounting aperture in the panel.

It will be understood that modifications and variations may be effected without departing from the scope of the novel concepts of the present invention.

I claim as my invention:

1. Means for retaining a component carrying member in assembly on a panel having opposite faces and a mounting aperture with which the member is aligned in assembly and with a face of the member positionally opposing one face of the panel, comprising:

a solder well terminal and hollow mounting pin having base means adapted for fixed attachment to the member and a portion arranged to project from the member and through said aperture closely adjacent to the edge defining the aperture;

said pin being formed to receive and secure conductor means inserted through said base means;

said base means having bendable clenching lug means and spaced laterally extending shoulder structure engaging said member therebetween with said shoulder structure engaging said one face of the member and serving as a stop in confronting relation to said one face of the panel in assembly;

and locking lug means on and extending from the perimeter of said pin portion and presenting a locking edge projecting generally toward but spaced from said shoulder structure a distance about equal to the thickness of said panel to engage the opposite face of the panel retainingly;

whereby the panel is substantially gripped between said shoulder structure and said locking edge and removal of said member from the panel is thoroughly resisted.

2. Means as defined in claim 1, in which said hollow pin is of sheet metal, and said locking lug means comprise a plurality of resilient lugs struck from said portion of the pin and extending divergently therefrom and each having a free locking edge.

3. Means according to claim 1, in which said pin has a tubular body with a stop crown structure opposite said base means, and retaining prongs sheared from said body and bent inwardly into convergence and to project toward said crown structure, said prongs having base ends attached to said body adjacent to that end of said pin portion which is remote from said shoulder structure and also spaced from said locking lug means.

4. Means as defined in claim 2, wherein said pin comprises a tubular hollow body projecting substantially beyond said portion, said locking lug means comprising tab-like flanges extending outwardly divergently relative to said portion, and said body having inwardly convergently related retaining finger prongs extending in the opposite direction from said lugs and with base ends of the prongs integral with said body adjacently spaced relative to said lugs, there being openings into said body complementary to said fingers and said lugs.

5. Means for retaining a component-carrying member in assembly on a panel having a mounting aperture having opposed edges and with which the member is aligned in assembly, comprising:

a hollow sheet metal pin having base means adapted for fixed attachment to the member and a tubular portion arranged to project from the member and through said aperture between said edges, with the member positionally opposing one face of the panel;

and a plurality of locking lugs struck out from said portion of the pin and extending divergently therefrom and presenting free locking edges into positional opposition to the opposite face of the panel;

said lugs being disposed in equally spaced circumferential series and in an uneven number so that at diametrically opposite sides of said portion one of said lugs will fully oppose the panel adjacent to one of said opposed edges and two of the lugs will be in at least partial locking confrontation to the panel at the other of the opposed edges.

6. In combination in an assembly including a member and a mounting panel having opposite faces and a mounting aperture with which the member is aligned and with a face of the member positionally opposing one face of the panel:

a solder well terminal and hollow mounting pin having base means fixedly attached to the member and a portion projecting from the member and through said aperture closely adjacent to the edge defining the aperture;

said pin being formed to receive and secure conductor means inserted through said base means;

said base means having terminal clenching lugs and spaced laterally extending shoulder structure engaging said member therebetween with said shoulder structure engaging said one face of the member and serving as a stop in confronting relation to said one face of the panel;

and locking lug means on and extending from the perimeter of said pin portion and presenting a locking edge projecting generally toward but spaced from said shoulder structure a distance about equal to the thickness of said panel and retainingly engaging the opposite face of the panel, so that the panel is substantially gripped between said shoulder structure and said locking edge and removal of said member from the panel is thoroughly resisted.

7. The combination of claim 6, in which said member comprises a carrying strip on which a plurality of electrical terminals are mounted and project through said aperture in the same direction as said pin, said pin being located on one end portion of the strip and a second like mounting pin being mounted on the opposite end portion of the strip, the locking lug means of each pin being of uneven number said pins cooperating to lock the strip in position on the panel.

8. The combination of claim 6, in which said member comprises a one-piece dielectric tube socket having thereon a plurality of electrical terminals which project through said aperture in the same direction as said pin, and the socket carrying a second like mounting pin spaced from said first mentioned mounting pin and also having a like locking lug lockingly opposing the panel.

9. In combination with a member which is adapted for assembly with a panel having opposite faces and a mounting aperture with which the member is to be aligned in assembly and with a face of the member positionally opposing one face of the panel in such assembly, comprising:

a combination solder well terminal and hollow mounting pin having base means fixedly attached to the member and a portion projecting from the member to be received through said aperture closely adjacent to the edge defining the aperture;

said pin being formed to receive and secure conductor means inserted through said base means;

said base means having clenching lug means and spaced laterally extending shoulder structure engaging said member therebetween with said shoulder structure engaging said one face of the member and serving as a stop in confronting relation to said one face of the panel in the assembly;

and locking lug means on and extending from the perimeter of said pin portion and presenting a locking edge projecting generally toward but spaced from said shoulder structure a distance about equal to the thickness of said panel and adapted for retaining engagement with the opposite face of the panel for the purpose of substantially gripping the panel between said shoulder structure and said lug edge so that removal of the member from the panel will be thoroughly resisted.

10. Means according to claim 9, in which said pin has a tubular body with a stop crown structure opposite said base means, and retaining prongs sheared from said body and bent inwardly into convergence and to project toward said crown structure, said prongs having base ends attached to said body adjacent to that end of said pin portion which is remote from said shoulder structure and also spaced from said locking lug means.

References Cited

UNITED STATES PATENTS

| | | | |
|---|---|---|---|
| 2,803,000 | 8/1957 | Johanson | 339—258 |
| 2,830,278 | 4/1958 | Schwarz | 339—275 X |
| 2,857,582 | 10/1958 | Wintress | 339—275 X |
| 2,917,723 | 12/1959 | Gluck | 339—275 X |
| 3,155,447 | 11/1964 | Hearther et al. | 339—275 X |
| 3,156,517 | 11/1964 | Maximoff et al. | 339—275 X |
| 3,187,297 | 6/1965 | Gluntz | 339—217 |
| 3,355,701 | 11/1967 | Biba | 339—220 X |

FOREIGN PATENTS

| | | |
|---|---|---|
| 233,672 | 5/1964 | Austria. |
| 848,480 | 9/1960 | Great Britain. |
| 75,651 | 2/1919 | Germany. |

RICHARD E. MOORE, *Primary Examiner.*

U.S. Cl. X.R.

339—220, 275